United States Patent [19]
Coad et al.

[11] Patent Number: 5,738,767
[45] Date of Patent: Apr. 14, 1998

[54] SUBSTRATE HANDLING AND PROCESSING SYSTEM FOR FLAT PANEL DISPLAYS

[75] Inventors: George L. Coad, Lafayette; Eric C. Lawson, Sunnyvale; John Lester Hughes, Rodeo, all of Calif.

[73] Assignee: Intevac, Inc., Santa Clara, Calif.

[21] Appl. No.: 342,275

[22] Filed: Nov. 23, 1994

Related U.S. Application Data

[63] Continuation-in-part of Ser. No. 179,903, Jan. 11, 1994, abandoned.

[51] Int. Cl.$^6$ .................................................. C23C 14/34
[52] U.S. Cl. ........................ 204/192.12; 204/298.25; 204/298.28; 414/217; 414/222
[58] Field of Search .................. 204/192.12, 192.32, 204/298.25, 298.26, 298.28, 298.35; 118/719, 729, 730; 414/217, 222

[56] References Cited

U.S. PATENT DOCUMENTS

| | | | |
|---|---|---|---|
| 3,294,670 | 12/1966 | Charschan et al. | 204/298 |
| 3,945,903 | 3/1976 | Svendor et al. | 204/192 |
| 4,274,936 | 6/1981 | Love | 204/192 R |
| 4,675,096 | 6/1987 | Tateishi et al. | 204/298 |
| 4,761,218 | 8/1988 | Boys | 204/298 |
| 4,785,962 | 11/1988 | Toshima | 220/260 |
| 4,795,299 | 1/1989 | Boys et al. | 414/217 |
| 4,951,601 | 8/1990 | Maydan et al. | 118/719 |
| 4,995,958 | 2/1991 | Anderson et al. | 204/298 |
| 5,252,194 | 10/1993 | Demaray et al. | 204/298.2 |
| 5,288,379 | 2/1994 | Namiki et al. | 204/192.12 |

FOREIGN PATENT DOCUMENTS

| | | |
|---|---|---|
| 62-207866 | 12/1987 | Japan . |
| 4-137522 | 5/1992 | Japan . |

OTHER PUBLICATIONS

"Inline Sputtering System For ITO Conductive Transparent Films, SDP Series", Ulvac Corporation, No. 104, date unknown.
"Improvement Points of Sputtering and Plasma CVD Equipments for LCD", Ulvac Corporation, pp. 1–10, date unknown.
"Sputtering Equipment for LCD", Ulvac Corporation, pp. 1–7, date unknown.
"Sputtering Systems for LCD's", Leybold AG, 12–900.02, date unknown.

Primary Examiner—Nam Nguyen
Attorney, Agent, or Firm—Stanley Z. Cole; William McClellan

[57] ABSTRACT

A vacuum processing system for handling and processing rectangular glass panels for flat panel displays has a cluster configuration. The system includes a central buffer chamber, with multiple processing chambers, a load lock and an unload lock positioned around the buffer chamber and coupled to the buffer chamber through gate valves. The buffer chamber contains a turntable that is rotatable about a vertical axis. The system further includes substrate carriers, each for supporting a substrate in a vertical orientation as it is transported through the system and is processed. The turntable has dual substrate carrier positions for rotating substrate carriers into alignment with a selected processing chamber, the load lock or the unload lock. Multiple substrates can be handled and processed concurrently to achieve a high throughput rate. The system is typically used for sputter deposition of ITO films and metal films on the glass substrate.

25 Claims, 11 Drawing Sheets

SUBSTRATE HANDLING AND PROCESSING SYSTEM FOR FLAT PANEL DISPLAYS

CROSS REFERENCE TO RELATED APPLICATION

This application is a continuation-in-part of application Ser. No. 08/179,903 filed Jan. 11, 1994, abandoned.

FIELD OF THE INVENTION

This invention relates to automated systems for processing flat panel displays and, more particularly, to methods and apparatus for handling and processing glass panels in vacuum with high throughput and minimum contamination.

BACKGROUND OF THE INVENTION

The fabrication of flat panel displays involves the deposition of various films, including indium tin oxide (ITO) and metals, on large glass panels. The glass panels, which are typically rectangular, may have dimensions up to 450 mm by 550 mm or greater. ITO and metals can be deposited on the glass panels by sputtering from a target of the material to be deposited. In some cases, such as ITO, the target material may react with a gas, such as oxygen, in the sputtering chamber. Sputtering typically involves heating of the substrate and deposition of the desired film on the heated substrate. The substrate may be preheated in a separate chamber prior to sputtering.

Production systems for sputter deposition of films on glass panels should have automated substrate handling, a high throughput rate, minimum particulate contamination, small floor space requirements and high reliability.

One existing system for sputter deposition on flat panel displays is the so-called "inline" system, wherein substrates are moved along a linear or U-shaped path through various processing chambers. One disadvantage of such systems is that they require a large amount of floor space in the fabrication facility. In addition, such systems have limited flexibility in that only serial processes can be allowed; no parallel processing can be done.

Another existing system for sputter deposition of flat panel displays is the so-called "cluster tool". In the cluster tool, multiple processing chambers are positioned around a central chamber. The substrates are transferred from the central chamber into selected processing chambers. Existing systems have utilized a configuration where the substrate has a horizontal orientation and thus is subject to increased particulate contamination. Existing systems have also had a limited throughput rate.

All known systems for fabrication of flat panel displays have had one or more disadvantages, including yield loss due to particulate contamination, low throughput rates, high downtime due to frequent cleaning and target changes, inability to handle large panels, poor process monitoring, large floor space requirements and large clean room requirements. It is an object of the present invention to provide methods and apparatus for handling and processing substrates for flat panel displays which overcome the above disadvantages.

SUMMARY OF THE INVENTION

According to one aspect of the invention, a vacuum processing system is provided. The vacuum processing system comprises a load lock for loading substrates into the system, a plurality of processing chambers for processing the substrates, an unload lock for unloading the substrates from the system, and a central buffer chamber coupled to the load lock, to each of the processing chambers and to the unload lock through gate valves. The buffer chamber contains a turntable that is rotatable about a vertical axis. The system further comprises rotation means for rotating the turntable about the vertical axis, two or more substrate carriers, each for supporting a substrate in a vertical orientation as it is transported through the system and is processed, transport means for transporting the substrate carriers to and between the load lock and the turntable, to and between the turntable and selected processing chambers, and to and between the turntable and the unload lock. The system further comprises control means for controlling the rotation means and the transport means such that each of the substrate carriers follows a selected path through the system.

Preferably, the turntable includes first and second substrate carrier positions equally spaced from the vertical axis of rotation of the turntable by a distance D. The transport means includes means for moving the substrate carriers between the load lock and the first and second substrate carrier positions on the turntable. The transport means further includes means for moving the substrate carriers between the first and second substrate carrier positions on the turntable and the processing chambers. Finally, the transport means includes means for moving the substrate carriers between the first and second substrate carrier positions on the turntable and the unload lock.

The load lock includes a door having means for holding a substrate. After the door is closed and the load lock has been evacuated, one of the substrate carriers is transported into the load lock, and the substrate is transferred from the holding means onto the substrate carrier. The unload lock includes a door having means for holding a substrate. The substrate and the substrate carrier are transported from the turntable into the unload lock, the substrate is transferred from the substrate carrier to the holding means, and the substrate carrier is transported back to the buffer chamber before the unload lock is vented. As a result, the substrate carrier is never exposed to atmosphere, and contamination from deposits on the substrate carrier is thereby minimized.

The load lock and the unload lock may each comprise an enclosure defining a lock chamber, a carrier transport assembly for transporting a substrate carrier to and between the lock chamber and the central buffer chamber, a door assembly including a door, a substrate support arm and a transfer mechanism for transferring a substrate to and between the support arm and the substrate carrier, and a linear drive mechanism for linearly moving the door assembly between an open position for transfer of a substrate to or from the support arm and a closed position for transfer of the substrate to and between the support arm and the substrate carrier.

Typically, the substrates are rectangular or square glass substrates. The substrate carriers hold the substrate in a vertical orientation, with its edges at about 45° with respect to horizontal, as the substrate is transported through the system and is processed.

In a preferred embodiment, six processing chambers are located around the central buffer chamber, and six substrate carriers are used for transporting substrates through the system. The processing chambers may include three sputtering chambers and three preheating chambers.

According to another aspect of the invention, a method for handling substrates in a vacuum processing system is provided. The vacuum processing system includes a central buffer chamber, a load lock, an unload lock, two or more processing chambers disposed around the buffer chamber and coupled to the buffer chamber, and two or more substrate carriers for transporting substrates within the system. The method comprises the steps of loading a substrate into the load lock and evacuating the load lock, transferring the substrate to one of the substrate carriers, transporting the substrate and the substrate carrier from the load lock onto a turntable in the buffer chamber, rotating the turntable about a vertical axis of rotation into alignment with a selected processing chamber, transporting the substrate and the substrate carrier from the turntable into the selected processing chamber, processing the substrate in the selected processing chamber, transporting the substrate and the substrate carrier from the selected processing chamber onto the turntable, rotating the turntable into alignment with the unload lock, transporting the substrate and the substrate carrier from the turntable into the unload lock, and venting the unload lock and removing the substrate from the unload lock. The preceding steps are repeated for two or more substrates in a time-multiplexed manner, such that two or more substrates are processed concurrently by the system.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
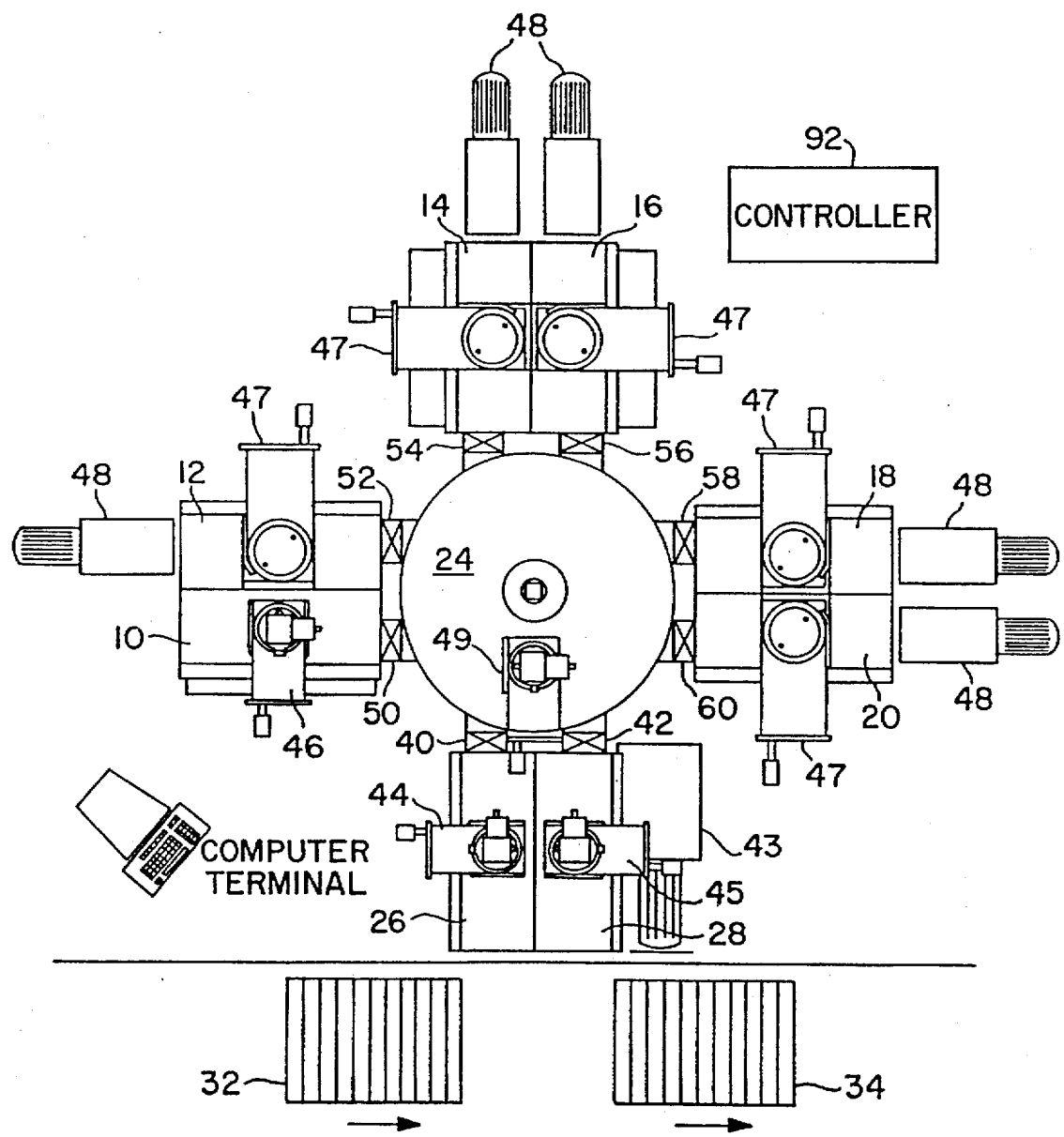
FIG. 1 is a layout diagram of a vacuum processing system in accordance with the invention.
Figure 2:
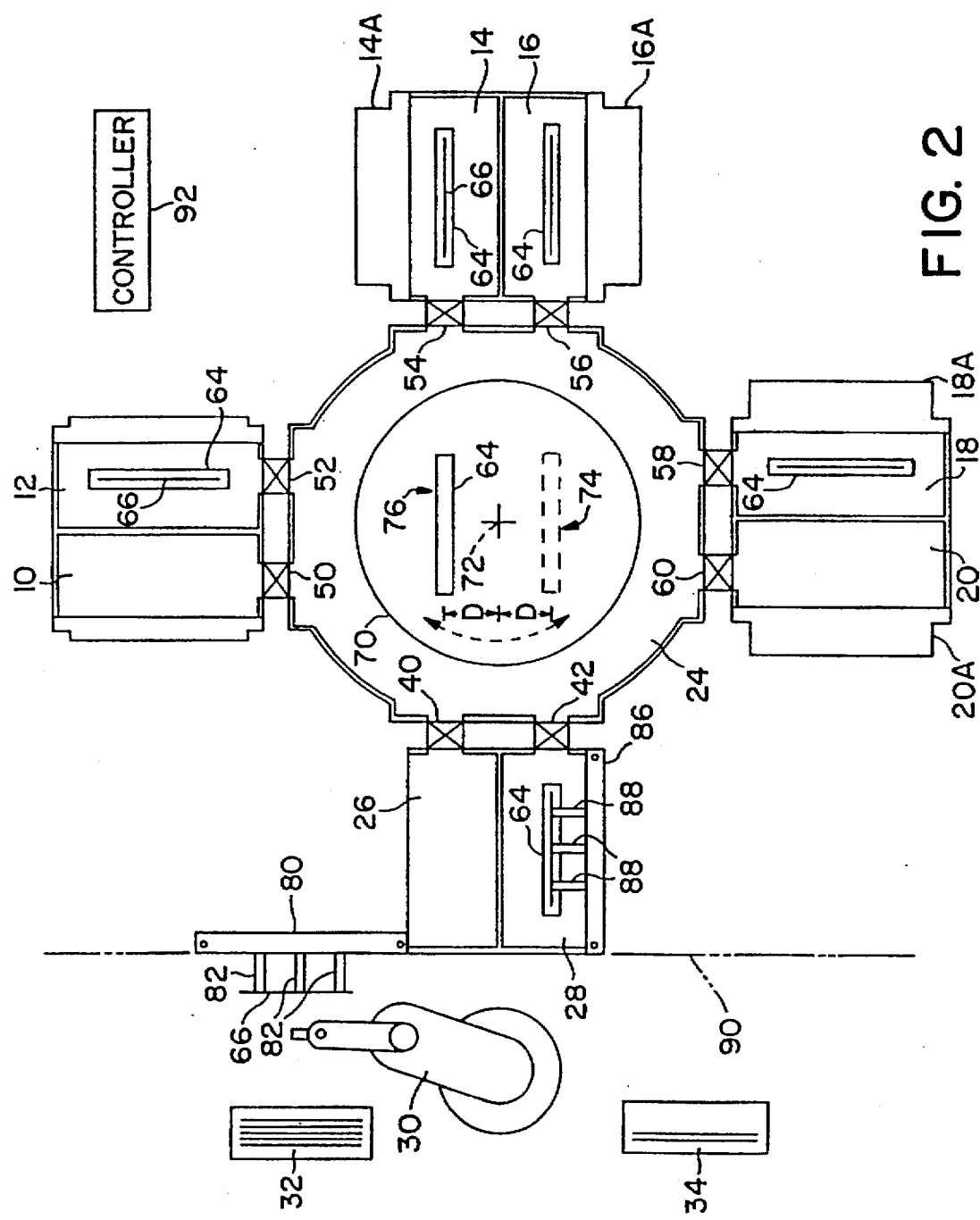
FIG. 2 is a schematic, cross-sectional top view of the system of FIG. 1, showing substrate handling and processing.

A layout diagram of a vacuum processing system in accordance with an embodiment of the present invention is shown in FIG. 1. A schematic, cross-sectional view of the system is shown in FIG. 2. Cabinets for a system controller, power distribution and control equipment, control equipment for vacuum pumps, and the like, which form part of the system, are omitted from FIGS. 1 and 2 for ease of understanding. The system is designed for handling and processing rectangular or square glass panels for flat panel displays. More particularly, the system is designed for sputter deposition of films on such glass panels. The system is designed primarily for sputter deposition of indium tin oxide (ITO) films and metal films, but is not limited to such films.

The vacuum processing system of the present invention utilizes a cluster configuration, wherein various processing stations are clustered around a central buffer chamber. As shown in FIGS. 1 and 2, processing stations 10, 12, 14, 16, 18 and 20 are positioned around a central buffer chamber 24. The processing chambers typically include heating chambers and sputter deposition chambers, and may include additional functions such as RF etch or RF bias. Substrates are loaded into the system through a load lock 26 and are removed from the system through an unload lock 28. Both the load lock 26 and the unload lock 28 are coupled to the buffer chamber 24. Substrates are loaded by a robot 30 from a load cassette 32 into the load lock 26. The substrates are unloaded by robot 30 from the unload lock 28 to an unload cassette 34.

The substrates are maintained in a vertical orientation at all times during handling and processing in the system. As a result, particulate contamination is minimized. The substrates are handled and processed by the system in a time multiplexed manner so that multiple substrates can be processed concurrently. A throughput rate of over 100 substrates per hour can be achieved with ITO film thickness of 2500 angstroms.

The load lock 26 and the unload lock 28 communicate with the central buffer chamber 24 through gate valves 40 and 42, respectively. Similarly, processing chambers 10, 12, 14, 16, 18 and 20 communicate with central buffer chamber 24 through gate valves 50, 52, 54, 56, 58 and 60, respectively. The load lock 26, the unload lock 28, each of the processing chambers and the central buffer chamber 24 are evacuated by separate vacuum pumping systems. In the example of FIG. 1, the load lock 26 and the unload lock 28 are vacuum pumped by a roughing pump 43 and cryopumps 44 and 45. Processing chamber 10 is evacuated by cryopump 46. Each of processing chambers 12, 14, 16, 18 and 20 is evacuated by a turbopump 47 and a foreline pump 48. The buffer chamber 24 is evacuated by a cryopump 49. It will be understood that different vacuum pumping configurations can be used within the scope of the present invention. For example, a turbopump or a cryopump can be used for vacuum pumping each of the processing chambers, depending on the requirements of a particular application. At any time during operation, only one of the gate valves is open, thus insuring isolation between the processing chambers and the load and unload locks.

Substrates are transported through the system on substrate carriers 64. Each substrate carrier 64 supports a substrate 66 in a vertical orientation. The substrate carriers 64 are described in detail below. Substrate carriers 64 holding substrates 66 are transported through the system by carrier transport assemblies between the different chambers and a turntable 70 mounted within buffer chamber 24 for rotation about a vertical axis 72. The turntable 70 includes substrate carrier positions 74 and 76 for retaining substrate carriers 64 during rotation of turntable 70. In FIG. 2, an empty substrate carrier 64 is present in position 76, and position 74 is empty. The substrate carrier positions 74 and 76 on turntable 70 are spaced from vertical axis 72 by equal distances D. The distance D is selected to insure alignment of the substrate carrier positions 74 and 76 with substrate processing positions in processing chambers 10, 12, 14, 16, 18 and 20 and with load and unload positions in load lock 26 and unload lock 28, respectively. This configuration permits the substrate carrier 64 to be transported along a straight line between substrate carrier position 76 and load lock 26 and between position 76 and processing chamber 14. Similarly, a substrate carrier 64 can be transported along a straight line between position 74 and turntable 70 and unload lock 28 and between position 74 and processing chamber 16. Rotation of the turntable 70 by 180° causes positions 74 and 76 to be interchanged. Rotation of turntable 70 by 90° in a clockwise direction from the orientation shown in FIG. 2 causes substrate carrier position 76 to be aligned with processing chambers 12 and 18, so that a substrate carrier 64 in position 76 can be transported to or from either of these processing chambers. Similarly, position 74 is aligned with processing chambers 10 and 20, and a substrate carrier 64 in position 74 can be transported to or from either of these processing chambers. Rotation of turntable 70 by 90° in a counterclockwise direction from the orientation shown in FIG. 2 causes positions 74 and 76 to be interchanged.

The turntable arrangement shown in FIG. 2 permits a substrate and substrate carrier to be transported from load lock 26 into one of the substrate carrier positions 74, 76 on turntable 70 and from there into any selected processing chamber. After processing in the selected processing chamber, the substrate and substrate carrier can be transported into a second processing chamber or into the unload lock 28. Thus, the system has complete flexibility and, as described below, can process several substrates concurrently for high throughput.

In a first embodiment, the load lock 26 includes a door 80 having holders 82 for substrate 66. Similarly, the unload lock 28 includes a door 86 having holders 88 for a substrate. The door 80 of load lock 26 is shown in FIG. 2 in an open position, and the door 86 of unload lock 28 is shown in a closed position. In one example described below, the load lock 26 and the unload lock 28 include double pivoting mechanisms for moving the doors 80 and 86 between the open position, where the substrate 66 is accessed through a clean room wall 90, and the closed position, where the substrate is sealed within the respective lock. It will be understood that other door arrangements can be utilized.

A controller 92 controls the gate valves, the carrier transport assemblies, the load and unload locks, the processing chambers, the turntable and all other components of the system in accordance with the operation described herein. The controller 92 preferably includes a computer for storing operational sequences, process information and the like, and for controlling the above elements.

The gate valves 40, 42, 50, 52, 54, 56, 58 and 60 have elongated slits to permit passage of the substrate carrier 64 and the substrate 66. The gate valves should operate in about 0.5 to 0.7 seconds to achieve a high throughput rate. The gate valves are described in detail in application Ser. No. 08/180,205, filed Jan. 11, 1994, now U.S. Pat. No. 5,379,984 which is hereby incorporated by reference.

A typical sequence for handling and processing of a substrate is now described. The substrate 66 is transferred by robot 30 from load cassette 32 to holders 82 on the door 80 of load lock 26. Then the door 80 is pivoted to the closed and sealed position, and the load lock 26 is evacuated to a desired pressure level. When the desired pressure level is reached, the gate valve 40 is opened and a substrate carrier 64 is transported from position 76 on turntable 70 into load lock 26. The substrate 66 is transferred from holders 82 onto carrier 64, and the carrier 64 is transported through gate valve 40 to turntable 70. Then, the gate valve 40 is closed, and the turntable 70 is rotated so that the substrate and substrate carrier 64 in position 76 are aligned with a selected processing chamber, for example, processing chamber 12. Then, the gate valve 52 is opened, and the substrate and the substrate carrier 64 are transported from turntable 70 into processing chamber 12. The gate valve 52 is closed, and the substrate is processed in processing chamber 12. The process in chamber 12 may involve preheating of the substrate. Since the gate valve 52 is closed, other substrates and substrate carriers can be moved while the substrate is being processed in processing chamber 12. When the process in chamber 12 is complete, the gate valve 52 is opened and the substrate and substrate carrier 64 are transported onto turntable 70. The turntable 70 is typically rotated into alignment with a second selected processing chamber, for example, processing chamber 14. The gate valve 54 is opened, and the substrate and substrate carrier 64 are transported from turntable 70 into processing chamber 14. The gate valve 54 is closed, and the substrate is processed in chamber 14. The process in chamber 14 may involve sputter deposition of an ITO film or a metal film. When the process in chamber 14 is complete, gate valve 54 is opened and the substrate and substrate carrier 64 are transported onto turntable 70. The gate valve 54 is closed, and the turntable 70 is rotated into alignment with unload lock 28. The gate valve 42 is opened, and the substrate and the substrate carrier 64 are transported into the unload lock 28. The substrate is transferred from substrate carrier 64 to holders 88, and the substrate carrier 64 is transported back to turntable 70. Then, gate valve 42 is closed, and the unload lock 28 is vented to atmosphere. Finally, the door 86 is opened to a position equivalent to that shown for door 80, and the robot 30 transfers the substrate from holders 88 to unload cassette 34.

The handling and processing of a single substrate is described above. In the embodiment of FIGS. 1 and 2, the system includes six processing chambers and six substrate carriers. The turntable 70 has two substrate carrier positions 74 and 76. In one specific example, processing chambers 10 and 12 are used for preheating of substrates, and chambers 14, 16, 18 and 20 are used for sputter coating of substrates. Furthermore, the processing chambers 10, 12, 14, 16, 18 and 20, the load lock 26 and the unload lock 28 are isolated from the buffer chamber 24 by gate valves. This configuration permits multiple substrates to be handled and processed concurrently in a time multiplexed manner, thus achieving a high throughput rate. For example, gate valve 54 is closed during the time that a substrate is being processed in processing chamber 14. During this time, additional substrates can be transferred from the load lock to another of the processing chambers, substrates can be transferred from one processing chamber to another processing chamber, and substrates can be transferred from a processing chamber to the unload lock. An example of a complete cycle of the processing system is shown in Table I below. In this example, four substrates are processed in a complete cycle. In Table I, each step represents movement of a substrate to or from a specified processing chamber, from the load lock, or to the unload lock.

TABLE I

Figure 3:
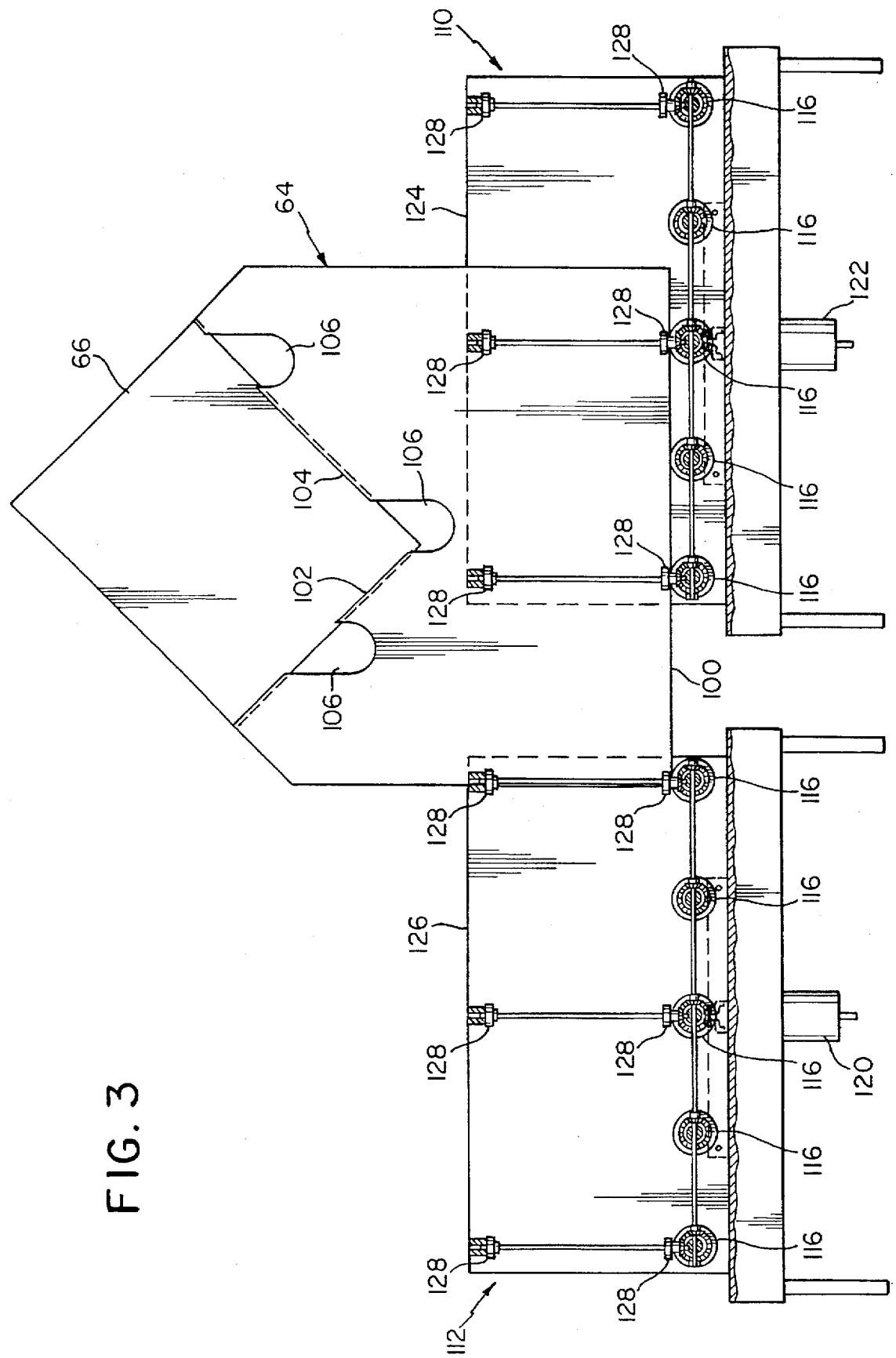
FIG. 3 is a schematic elevation view showing a substrate carrier and carrier transport assemblies used in the vacuum processing system.
Figure 4:
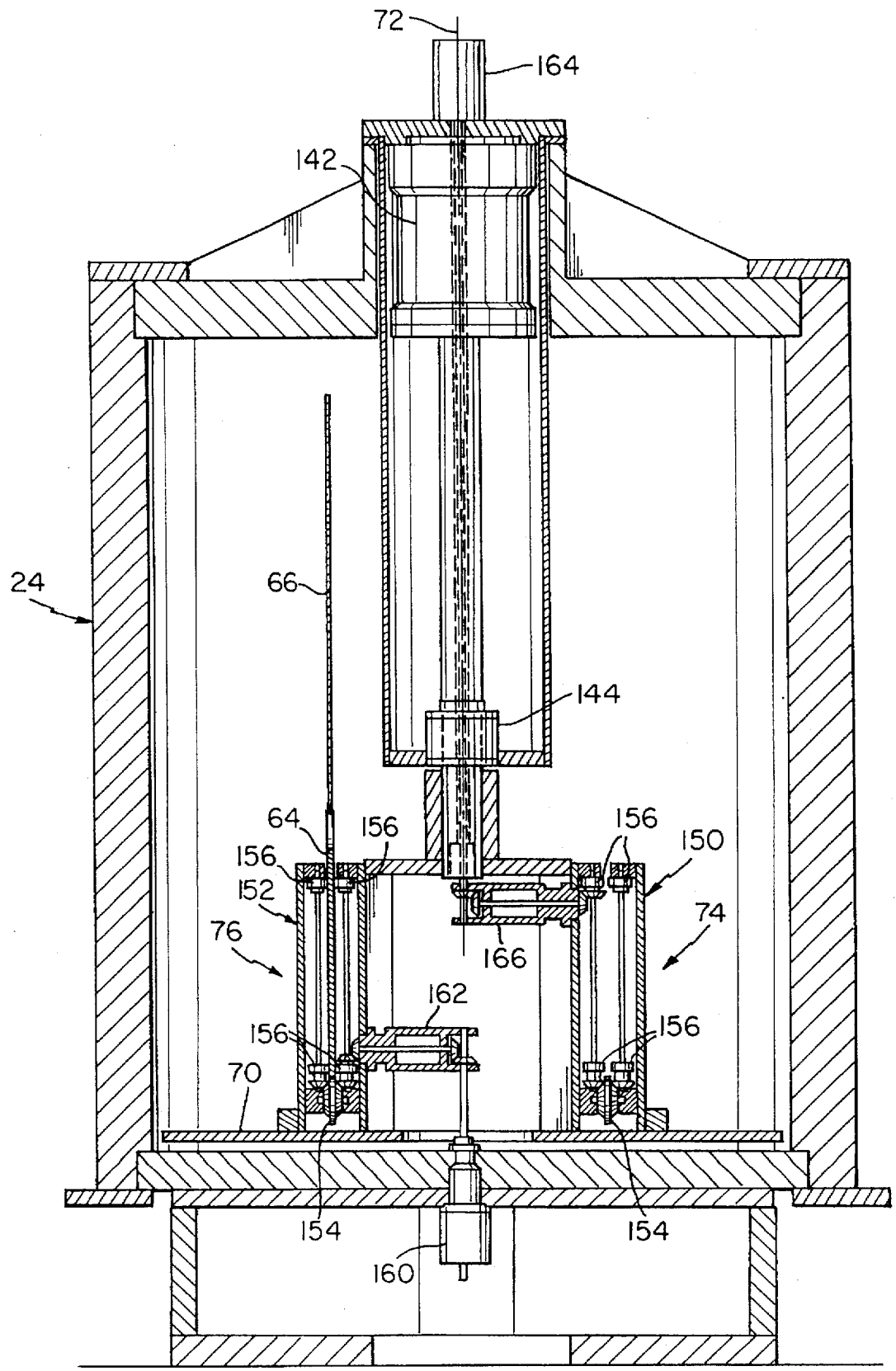
FIG. 4 is a schematic, cross-sectional elevation view showing the buffer chamber and turntable used in the vacuum processing system.

Chamber 20 out
To unload lock 28
Chamber 12 out
Chamber 20 in
From load lock 26
Chamber 12 in
Chamber 18 out
To unload lock 28
Chamber 10 out
Chamber 18 in
From load lock 26
Chamber 10 in
Chamber 16 out
To unload lock 28
Chamber 12 out
Chamber 16 in
From load lock 26
Chamber 12 in
Chamber 14 out
To unload lock 28
Chamber 10 out
Chamber 14 in
From load lock 26
Chamber 10 in A schematic diagram of the substrate carrier 64 and carrier transport assemblies for transporting substrate carrier 64 is shown in FIG. 3. The carrier transport assemblies are also shown in FIG. 4. The substrate carrier 64 is preferably a metal plate, such as stainless steel, having a lower edge 100 for resting on rollers in each carrier transport assembly and upper edges 102 and 104 for supporting substrate 66. In use, the metal plate of substrate carrier 64 and substrate 66 have a vertical orientation. The upper edges 102 and 104 form a right angle and include V-shaped grooves for receiving the edges of substrate 66. In a preferred embodiment, the grooved upper edges 102 and 104 of substrate carrier 64 are oriented at about 45° with respect to horizontal. Substrate 66 is supported along two edges by substrate carrier 64. The substrate carrier 64 further includes U-shaped notches 106 that extend downwardly from edges 102 and 104. The notches 106 are dimensioned to receive holders 82 on load lock door 80 and holders 88 on unload lock door 86. The substrate 66 is lowered onto the substrate carrier 64 by holder 82 when the substrate is being introduced into the system. Also, the substrate 66 is lifted from substrate carrier 64 by holders 88 after completion of processing. In a preferred embodiment, substrate carrier 64 is dimensioned to accommodate rectangular glass substrates up to 450 mm×550 mm, with a thickness of 1.1 mm. However, it will be understood that the substrate carrier 64 can be designed to accommodate substrates of different sizes and thicknesses.

The substrate carrier 64, with or without substrate 66, is transported within the system shown in FIGS. 1 and 2 by a system of carrier transport assemblies. Each of the processing chambers 10, 12, 14, 16, 18 and 20, load lock 26 and unload lock 28 includes a carrier transport assembly. In addition, carrier transport assemblies are mounted on turntable 70 for transporting substrate carriers to and from positions 74 and 76. The carrier transport assemblies on turntable 70 rotate with the turntable so that they may be aligned with the carrier transport assembly in a selected processing chamber, the load lock or the unload lock.

In FIG. 3, a carrier transport assembly 110 may be located within buffer chamber 24 and a carrier transport assembly 112 may be located in load lock 26, unload lock 28, or one of the processing chambers 10, 12, 14, 16, 18 and 20. The carrier transport assembly 110 within buffer chamber 24 is physically separate from the carrier transport assemblies in the processing chamber, the load lock and the unload lock, because these chambers are isolated from the buffer chamber by the respective gate valves, except when the substrate carrier 64 is being transported between chambers. Furthermore, at least a portion of the carrier transport assembly 110 within buffer chamber 24 is mounted on and rotates with turntable 70 (FIG. 4) so that the substrate carrier 64 can be aligned with a selected processing chamber, with the load lock 26 or with the unload lock 28.

Each of the carrier transport assemblies 110 and 112 includes a plurality of rollers 116. The lower edge 100 of substrate carrier 64 rests on the rollers 116. The rollers 116 of carrier transport assembly 112 are driven by a motor 120, and the rollers 116 of carrier transport assembly 110 are driven by a motor 122. The substrate carrier 64 can be transported in either direction by energizing the motors 120 and 122. The spacing between carrier transport assemblies 110 and 112 is sufficiently small that the substrate carrier 64 can be transported from one carrier transport assembly to the other with a smooth, uninterrupted movement. Carrier transport assembly 110 further includes upstanding parallel sidewalls 124 (only one of which appears in FIG. 3) on the front and back sides of substrate carrier 64. Guide wheels 128 mounted on parallel sidewalls 124 abut against the front and back sides of the substrate carrier 64. The guide wheels 128 are driven by the motor 122. Thus, the guide wheels 128 maintain the substrate carrier 64 in a vertical orientation and assist in transporting the substrate carrier 64 through the system. Similarly, carrier transport assembly 112 includes upstanding sidewalls 126 with driven guide wheels 128.

Substrate carrier 64 and carrier transport assemblies 110 and 112 maintain the substrate 66 in a vertical orientation during the entire time that the substrate is being handled and processed within the system. Thus, the possibility of particulate contamination is greatly reduced in comparison with systems wherein the substrate is maintained in a horizontal orientation during handling and processing. In systems with horizontal substrate handling, particles can collect on the upper surface of the substrate, thereby contaminating the substrate. In addition, the substrate 66 is held by its edges, thus minimizing the possibility of damage to the substrate surface during handling. Finally, the substrate 66 is maintained above the carrier transport assemblies 110 and 112, thus minimizing the possibility that particles from moving parts of the carrier transport assembly will contaminate the substrate.

During processing, the substrate 66 is held in a stationary position in one of the processing chambers by the substrate carrier 64. In the sputtering chambers, a coating of the material deposited on substrate 66 is also deposited on substrate carrier 64, at least in portions near upper edges 102 and 104. The coating builds up over time as the substrate carrier 64 is used to carry multiple substrates. If the substrate carrier 64 were exposed to atmosphere each time a new substrate were loaded into the system, the coating would absorb nitrogen, oxygen, water vapor and other gases. When the substrate carrier 64 was returned to the processing chamber with a new substrate, outgassing from the coating could potentially contaminate the processing chamber. In order to avoid this problem, substrate carrier 64 is never exposed to atmosphere during the use of the vacuuming processing system. In particular, the substrate carrier 64 is located within buffer chamber 24 with gate valve 40 closed when a substrate is being loaded into the load lock 26. The gate valve 40 is opened and the substrate carrier 64 is transported into the load lock to receive the substrate only after the load lock 26 has been vacuum pumped. Similarly, the unload lock 28 is maintained at high vacuum when the substrate carrier 64 is transferring the substrate to holders 88. The unload lock is vented to atmosphere for removal of the substrate only after the substrate carrier 64 has been transported from unload lock 28 to turntable 70 and gate valve 42 has been closed. Thus, the substrate carriers 64 are not given an opportunity to absorb atmospheric gases which could later outgas within the processing chambers.

A schematic, cross-sectional, elevation view of the buffer chamber 24 and turntable 70 is shown in FIG. 4. Turntable 70 is mounted within buffer chamber 24 for rotation about the vertical axis 72. The turntable 70 is rotated by a turntable motor 142 located externally of the vacuum envelope of buffer chamber 24 and coupled to turntable 70 by a rotary vacuum feedthrough 144. A carrier transport assembly 150 is located in substrate carrier position 74, and a carrier transport assembly 152 is located in substrate carrier position 76 on turntable 70. Each of the carrier transport assemblies 150 and 152 includes driven rollers 154 and driven guide wheels 156 which support substrate carrier 64 in a vertical orientation and transport the substrate carrier 64 in a desired direction, as described above in connection with FIG. 3. A motor 160 located externally of the vacuum envelope of buffer chamber 24 is coupled through a rotary vacuum feedthrough and a right angle drive assembly 162 to carrier transport assembly 152. A motor 164 located externally of the vacuum envelope of buffer chamber 24 is coupled through a rotary vacuum feedthrough and a right angle drive assembly 166 to carrier transport assembly 150. The carrier transport assemblies 150 and 152 rotate with turntable 70 into alignment with a selected processing chamber, the load lock or the unload lock as described above.

As shown in FIG. 2, the processing chambers 14, 16, 18 and 20 include sputter sources 14A, 16A, 18A, and 20A, respectively. In each processing chamber, the substrate carrier and substrate are held in a stationary position relative to the respective sputter source, and a film of the desired composition and thickness is deposited on the substrate.

Figure 5A:
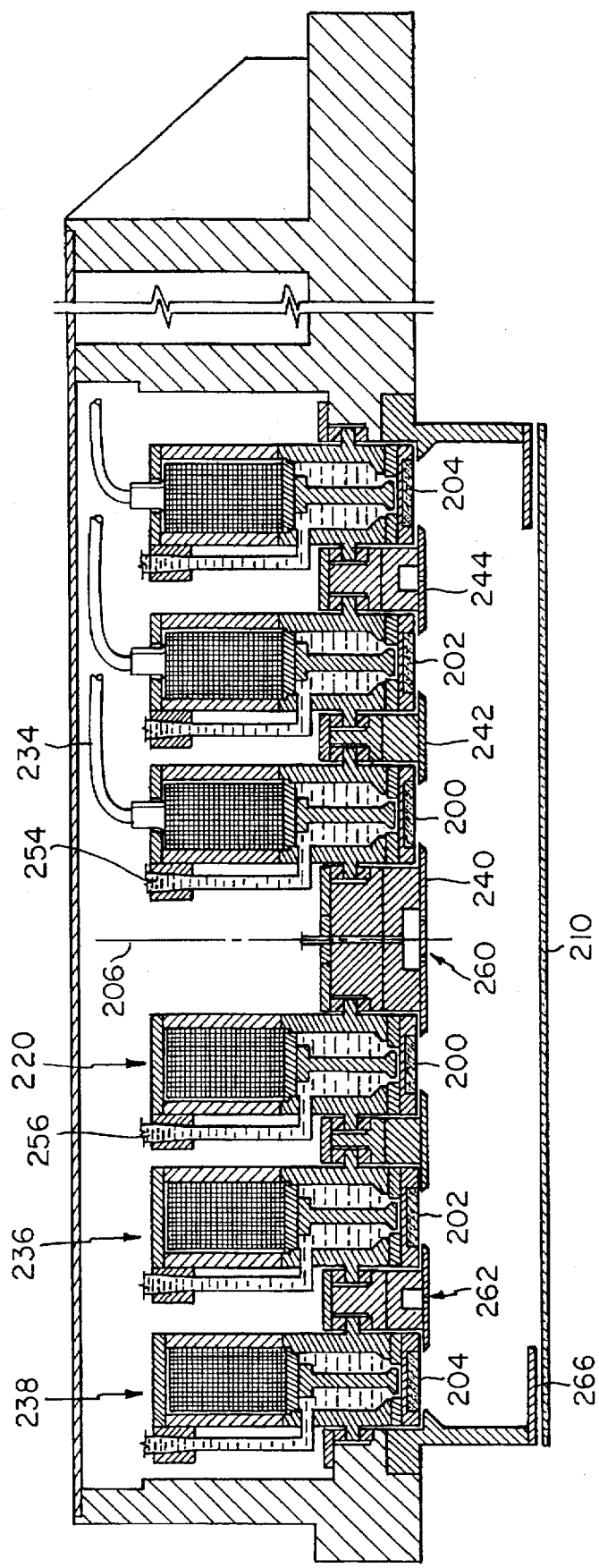
FIG. 5A is a cross-sectional view of the sputter source used in the vacuum processing system.

A cross-sectional view of a sputter source representative of each of the sputter sources 14A, 16A, 18A, and 20A, is shown in FIG. 5A. The sputter source is designed to deposit a film that has a thickness uniformity of ±3% over a rectangular glass panel of 450 mm×550 mm. The sputter source is also designed to achieve a high collection efficiency, on the order of about 29% which results in a high deposition rate. The source is designed for deposition of ITO films and metal films, but is not limited to these films.

The sputter source includes three concentric target rings, including an inner target ring 200, a middle target ring 202 and an outer target ring 204. The target rings 200, 202 and 204 are centered on an axis 206. The target rings are fabricated of a material to be deposited on a substrate 210 or a material that reacts with a gas in the sputtering chamber to form the material that is deposited on the substrate. Thus, for example, when ITO is being deposited on the substrate, the target rings 200, 202 and 204 comprise indium tin metal or indium:tin oxide, typically in the ratio of 90% indium and 10% tin. In an example for sputter coating of rectangular glass panels of 450 mm×550 mm, inner target ring 200 has a diameter of 195 mm and width of 50 mm, middle target ring 202 has a diameter of 431 mm and a width of 50 mm, and outer target ring 204 has a diameter of 692 mm and a width of 50 mm.

Figure 5B:
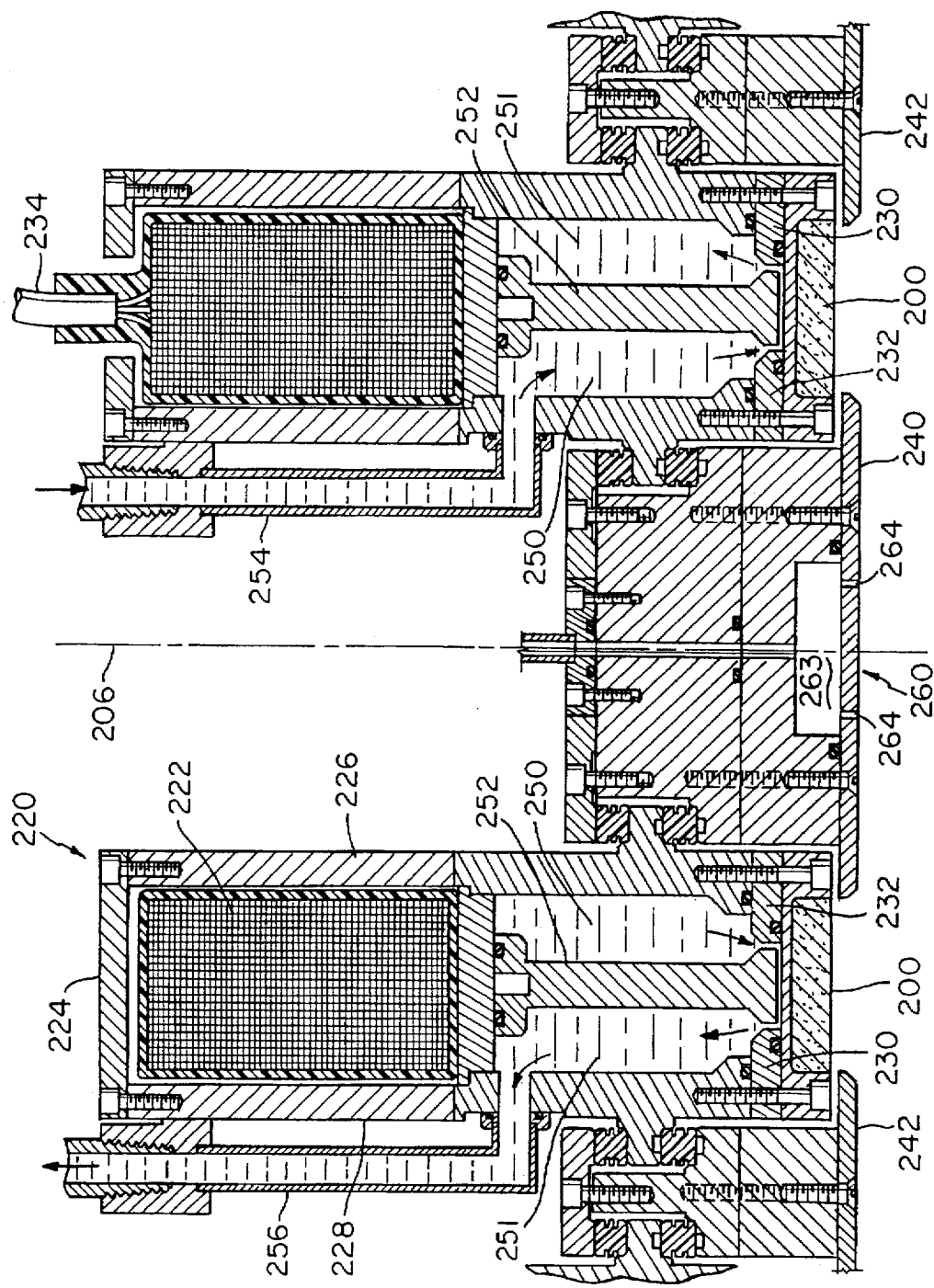
FIG. 5B is an enlarged, partial, cross-sectional view of the sputter source.

An electromagnet assembly 220 produces a magnetic field adjacent to inner target ring 200. An enlarged cross-sectional view of the inner target ring 200 and electromagnet assembly 220 is shown in FIG. 5B. The electromagnet assembly 220 includes an electromagnet coil 222 having annular windings, and a pole assembly for concentrating the magnetic field generated by electromagnet coil 222 in the region of inner target ring 200. The pole assembly includes an annular rear pole piece 224, generally cylindrical pole pieces 226 and 228, and spaced-apart, annular pole pieces 230 and 232 directly behind target ring 200 for shaping the magnetic field in the vicinity of the target ring. The electromagnet coil 222 is connected by leads 234 to a power source (not shown).

Electromagnet assemblies 236 and 238 generate magnetic fields adjacent to middle target ring 202 and outer target ring 204, respectively. The electromagnet assemblies 236 and 238 are similar to the electromagnet assembly 220 but have successively larger diameters corresponding to the diameters of the respective target rings. The electromagnet assemblies produce magnetic fields of about 300 gauss in the vicinity of the target rings.

The sputter source further includes anodes 240, 242 and 244 which have a circular configuration and are spaced from target rings 200, 202 and 204. A plasma power source (not shown) is connected between each of the target rings and the respective anodes. The anodes are typically grounded, and the target rings are typically operated at about 500 volts.

Each of the target rings 200, 202 and 204 is water cooled. Referring to FIG. 5B, the pole pieces 226 and 228 define enclosed passages 250 and 251 between electromagnet coil 222 and target ring 200. The passages 250 and 251 are separated by an annular water channel ring 252. Cooling water is introduced into passage 250 through an inlet 254. A small gap exists between water channel ring 252 and target ring 200. The cooling water flows from passage 250 in a radial direction through the gap to passage 251, thus removing heat from the target ring 200. The water is exhausted from passage 251 through an outlet 256.

The sputter source also includes reactive gas diffusers for introducing a reactive gas between the target rings and the substrate 210. A reactive gas diffuser 260 is located at the center of the sputter source, and an annular reactive gas diffuser 262 is located between the middle target ring 202 and outer target ring 204. The reactive gas diffuser 260 includes a cavity 263 for introduction of the reactive gas. The cavity 263 is covered by a plate having multiple holes 264 for diffusion of the gas from the cavity into the region between the sputter source and the substrate. The reactive gas diffuser 262 has a similar construction. As an example, oxygen is introduced into the region of the substrate during deposition of ITO.

A substrate shield 266, positioned between the target rings 200, 202 and 204 and the substrate 210, limits deposition on the substrate carrier. For a rectangular substrate, the substrate shield 266 has a rectangular opening that corresponds in size to the substrate.

The sputter deposition chamber is operated with argon at a pressure in the range of 1 millitorr to 20 millitorr. The crossed electric and magnetic fields at the surface of each of the target rings 200, 202 and 204 cause ionization of argon atoms. The argon ions bombard the target rings and erode atoms of the target material from each of the target rings. The sputtered target material is deposited as a film on the substrate surface. In the case of reactive sputtering, the sputtered target atoms react with a gas either at the target surface or on the substrate to form the desired molecule. In the sputtering source of FIGS. 5A and 5B, the electric and magnetic fields at each of the target rings 200, 202 and 204 are independently controllable. The rate of sputtering from each of the target rings can be adjusted by adjusting the sputtering power to the specific target ring to produce a uniform film thickness over the substrate area.

The sputter source configuration shown in FIGS. 5A and 5B and described above permits deposition of a film having a uniformity of about ±3% over the surface of a rectangular substrate having dimensions of 450 mm×550 mm. The substrate 210 is spaced from the target rings by about 100 mm in order to obtain a collection efficiency on the order of 29%. To achieve this uniformity and collection efficiency, the outside diameter of outer target ring 204 is preferably about equal to the diagonal dimension of the rectangular substrate. With this configuration, an ITO film having a thickness of 2,500 angstroms can be deposited in approximately 46 seconds using an indium:tin oxide target set at 12 kilowatts total power.

A second embodiment of the sputter source (not shown) utilizes a rotating magnetron field behind a sputtering target. The magnetron field is roughly cardioid shaped, with geometry and magnetic fields selected to achieve uniform erosion of the sputtering target. A preferred target is 0.25 inch thick by 32.50 inches in diameter. Sputter sources of this general type are disclosed in U.S. Pat. Nos. 4,995,958, issued Feb. 26, 1991 to Anderson et al, and U.S. Pat. No. 5,252,194, issued Oct. 12, 1993 to Demaray et al.

Figure 6:
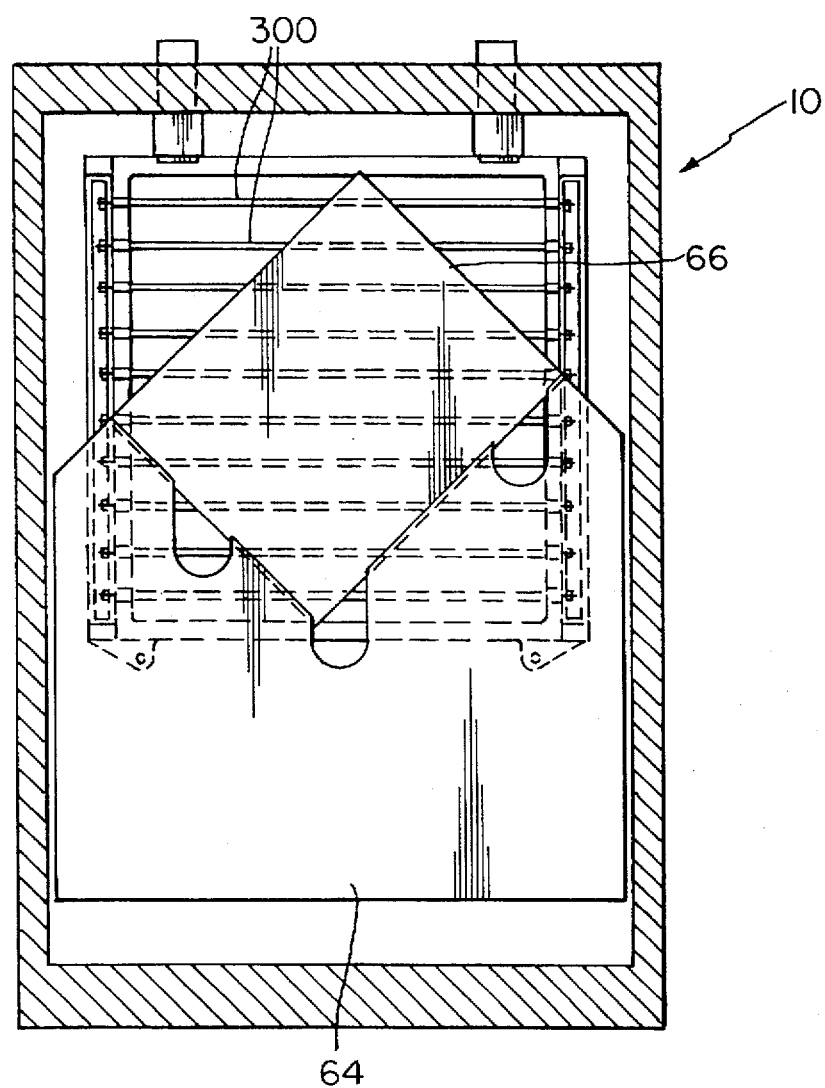
FIG. 6 shows the heater used in the preheating chambers and in the sputter deposition chambers.

A simplified cross-sectional view of a heating chamber corresponding to processing chambers 10 and 12 (FIG. 2) is shown in FIG. 6. Substrate carrier 64 holding substrate 66 is located in processing chamber 10. The heater comprises an array of tubular lamps 300, which may be quartz lamps. The lamps 300 are mounted parallel to each other in the array. The lamp array is sufficiently large to uniformly heat substrate 66. In the heating chambers 10 and 12, the lamps 300 irradiate the substrate 66 directly. Typically, a heater is also used in each sputter deposition chamber to sustain the temperature of the substrate during sputter deposition. In the sputtering chambers, the heater is mounted on the opposite side of the substrate from the sputter source and heats the back side of the substrate. In the sputtering chamber, a molybdenum (Mo) shield is used between the lamps 300 and the substrate to shield the lamps from sputter deposition. The molybdenum shield is heated by the lamps, and the shield heats the back side of the substrate 66. The shield may also be made of copper or graphite to improve temperature uniformity. The glass substrate is typically heated to a temperature between 250° C. and 450° C., depending on prior deposition of temperature sensitive materials.

Another option that can be employed in the disclosed system is so-called RF etch or RF bias. RF etch involves the application of an RF field to the substrate in a separate RF etch chamber. An RF voltage is applied to a conductive plate that is approximately the same size as the substrate and is closely spaced to the substrate. The RF field causes ionization of argon atoms within the chamber and bombardment of the substrate surface. In the case of RF bias, a conductive plate is closely spaced to the back side of the substrate in a sputter deposition chamber. An RF voltage applied to the conductive plate induces a DC bias on the substrate. The DC bias causes acceleration of ions being deposited on the substrate.

Figure 7:
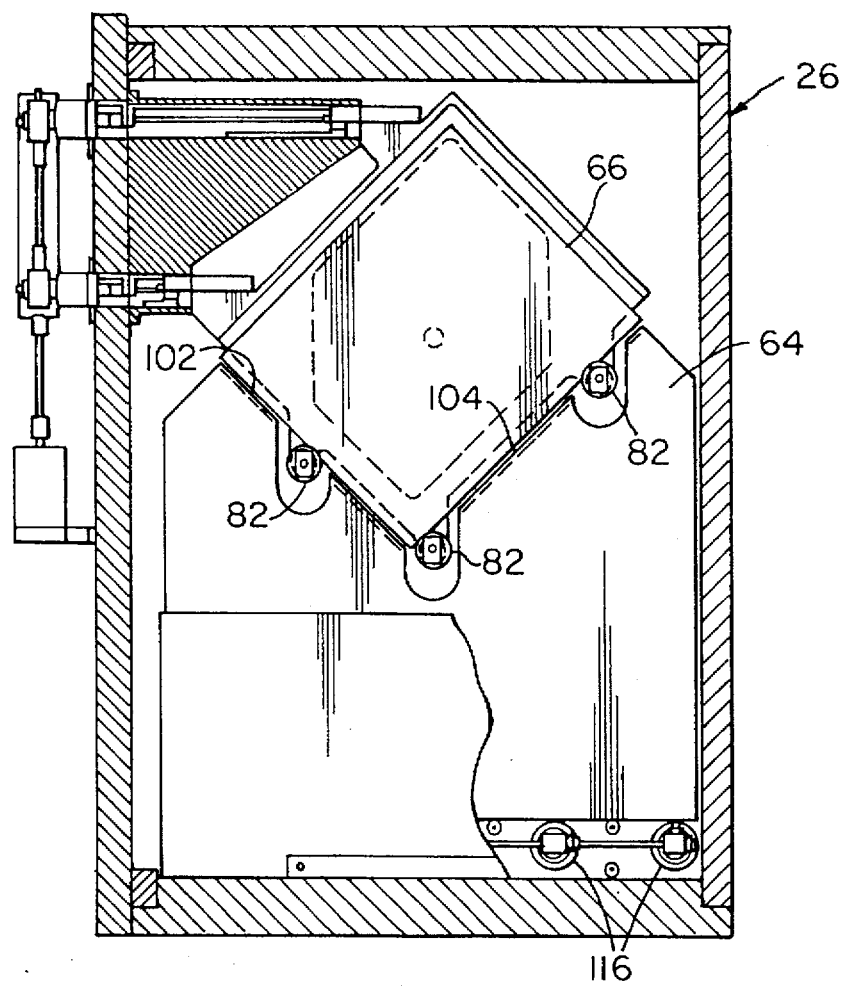
FIG. 7 shows an assembly used in the load lock and the unload lock for transferring substrates to and from substrate carriers.
Figure 8:
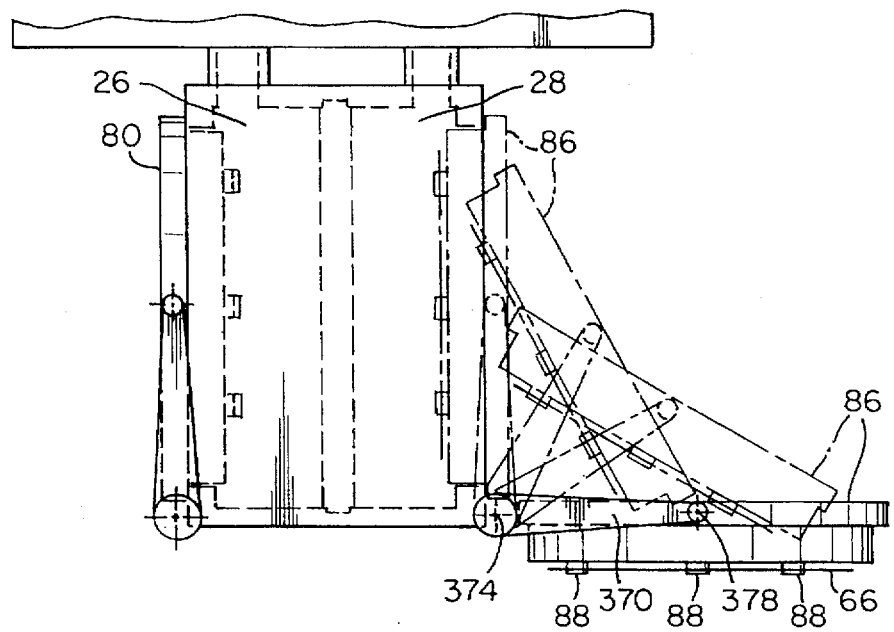
FIG. 8 is a schematic diagram that illustrates the motion of the unload lock door between open and closed positions.
Figure 9:
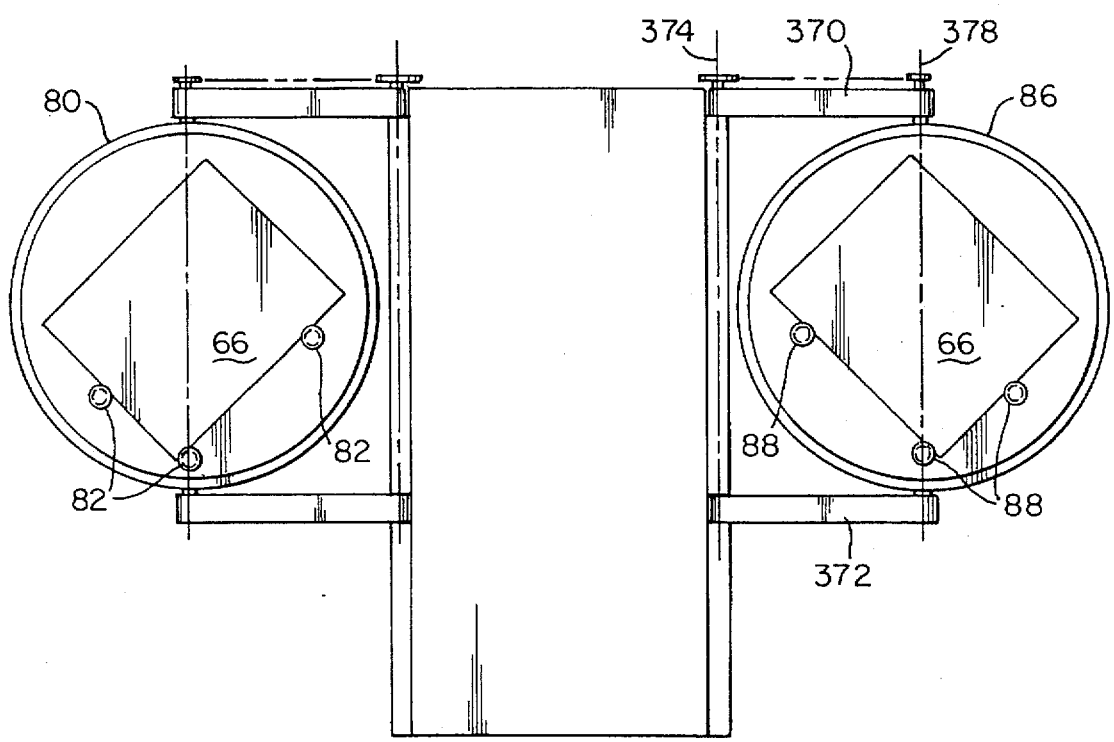
FIG. 9 is a schematic diagram that illustrates the lock doors in the open position.

The operation of the load lock 26 and the unload lock 28 is illustrated with reference to FIGS. 7–9. Initially, substrate 66 is placed on load lock door 80 and is supported by holders 82, as shown in FIG. 9. In a preferred embodiment, holders 82 comprise wheels having V-shaped grooves for receiving the edge of substrate 66. Referring now to FIG. 7, the transfer of the substrate 66 to the substrate carrier 64 is illustrated. The holders 82 are extended outwardly away from the door (perpendicular to the plane of FIG. 7) until the substrate 66 is directly above substrate carrier 64. Next, substrate carrier 64 is raised vertically so as to lift substrate 66 from holders 82. Then, holders 82 are retracted to the door, and substrate carrier 64 is lowered to its original position on rollers 116 with substrate 66 supported by edges 102 and 104. Substrate carrier 64 and substrate 66 are then ready to be transported into the vacuum processing system as described above. A similar mechanism is used in the unload lock 28 for transferring the substrate 66 from the substrate carrier 64 to holders 88 on door 86.

An example of a door opening mechanism for the load lock 26 and the unload lock 28 is described with reference to FIGS. 8 and 9. The purpose of the door opening mechanism is to move from a closed position, where the substrate is sealed within one of the locks, to an open position, where the substrate is presented, for example, through a clean room wall for transfer to or from the system. In FIG. 8, unload lock door 86 is shown in intermediate positions between the closed and open positions. The door 86 is supported by arms 370 and 372 which connect to the center of the top and the center of the bottom, respectively, of door 86. The arms 370 pivot about axis 374. As the arms 370 and 372 pivot about axis 374, the door 86 is rotated about an axis 378 by 90°, thus resulting in the desired movement. It will be understood that other door opening arrangements may be used within the scope of the present invention.

A preferred embodiment of the load lock and the unload lock for the vacuum processing system described above is shown in FIGS. 10–13. A load lock 400 is connected through gate valve 40 to buffer chamber 24 (FIGS. 1 and 2). An unload lock 402 is connected through gate valve 42 to buffer chamber 24. In the system described above, load lock 400 replaces load lock 26, and unload lock 402 replaces unload lock 28.

Load lock 400 includes a vacuum-tight enclosure 404, a door assembly 406 and a linear drive mechanism 407. Unload lock 402 includes a vacuum-tight enclosure 408, a door assembly 410 and a linear drive mechanism 411. In general, the unload lock 402 is a mirror image of the load lock 400. Thus, only unload lock 402 will be described in detail.

Figure 10:
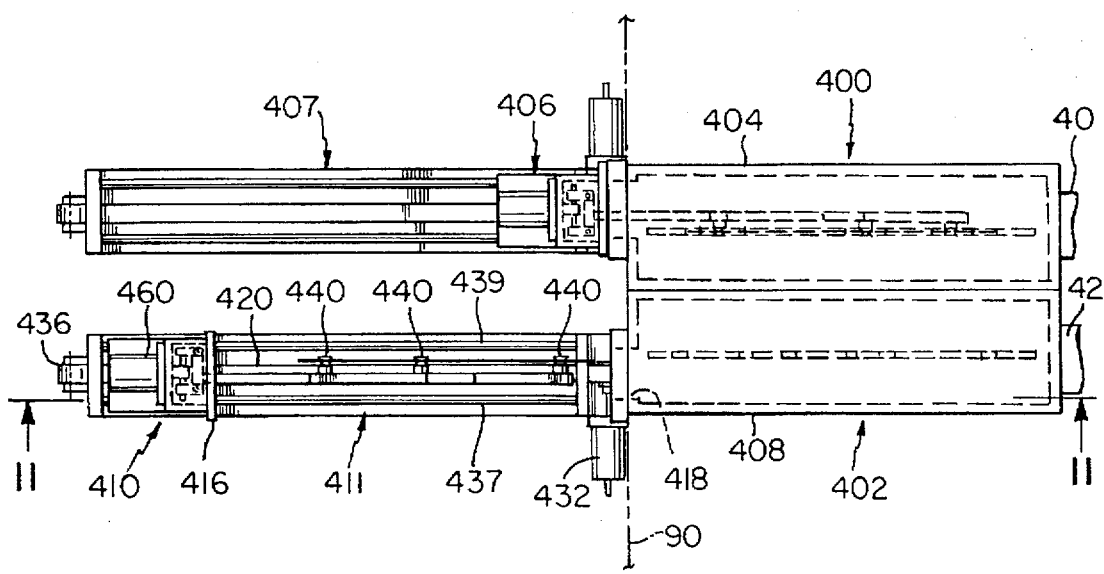
FIG. 10 is a top view of an alternate embodiment of the load lock and the unload lock.

The door assembly 410 of unload lock 402 includes a door 416 for sealing an opening 418 in enclosure 408. The door assembly 410 further includes a substrate support arm 420 and a transfer mechanism 422 for controlling the substrate support arm 420. The door assembly 410 is movable between an open position shown in solid lines in FIG. 11 and a closed position shown in phantom in FIG. 11. Referring to FIG. 10, the door assembly 406 is shown in the closed position, and the door assembly 410 is shown in the open position. The door assembly 410 is moved between the open and closed positions by the linear drive mechanism 411. The door assembly 410 and the linear drive mechanism 411 are supported by a structural member 430 attached to enclosure 408. The linear drive mechanism 411 includes a linear drive motor 432, a linear drive belt 434 and an idle roller 436. A carriage 438 is attached to the door assembly 410 and to the drive belt 434, so that the door assembly is movable along guide rods 437 and 439 between the open and closed positions when linear drive motor 432 is energized.

The substrate support arm 420 includes perpendicular legs 442 and 444 on which are mounted three wheels 440 having V-shaped grooves for supporting substrate 66. The wheels 440 are positioned to orient substrate 66 with its sides at about 45° with respect to horizontal.

The unload lock 402 is used for removing a substrate from the vacuum processing system. For removing a substrate from the system, the door assembly 410 is initially in the closed position so that the enclosure 408 of unload lock 402 is sealed vacuum tight. The unload lock enclosure 408 is evacuated by a vacuum pumping system, which may include roughing pump 43 and cryopumps 44 and 45 (FIG. 1), with gate valve 40 in the closed position. After evacuation of the unload lock enclosure 408, the gate valve 40 is opened, and a substrate carrier 446 is moved from buffer chamber 24 into the unload lock 402 by a carrier transport assembly 450. As described previously in connection with FIG. 3, the carrier transport assembly 450 includes rollers 452 and guide wheels 454 driven by a motor 456 for moving the substrate carrier 446 along a horizontal path between the buffer chamber 24 and the unload lock 402. A similar carrier transport assembly is located within buffer chamber 24.

With door assembly 410 in the closed position and the unload lock enclosure 408 evacuated, the substrate 66 is transferred from the substrate carrier 446 to the support arm 420 by the transfer mechanism 422, as described in detail below. The substrate 66 is lifted from the substrate carrier 446 and is held by the support arm 420. Then, the substrate carrier 446 is moved along a horizontal path back to the buffer chamber 24 by the carrier transport assembly 450, and the gate valve 40 is closed. The unload lock enclosure 408 is then vented to atmosphere, and the door assembly 410 is moved to the open position by energizing linear drive motor 432. The substrate 66 is moved parallel to its plane by door assembly 410, thus permitting door 416 and opening 418 to have relatively small dimensions and reducing air movement. When the door assembly 410 is in the open position, the substrate 66 is removed from support arm 420 by a robot.

In a preferred embodiment, the substrate carrier 446 comprises a metal plate in which three support V-wheels 451 and three constraint V-wheels 453 are mounted. Each of the V-wheels 451, 453 is mounted in the metal plate of substrate carrier 446 for rotation about an axis perpendicular to the plane of the metal plate and has a V-groove in its outer periphery for receiving the substrate. The three support V-wheels 451 support the substrate 66 in a vertical orientation with its sides at about 45° with respect to horizontal. The constraint V-wheels 453 are spaced from the substrate 66 in its nominal position by a small distance, such as 0.005 inch, and act as a constraint if the substrate warps by this amount. The configuration of the V-wheels 451 and 453 reduces the high friction that occurs at support points when the substrate expands during heating. The substrate carrier 446 further includes openings 455 that receive wheels 440 on substrate support arm 420 during transfer of a substrate.

Figure 11:
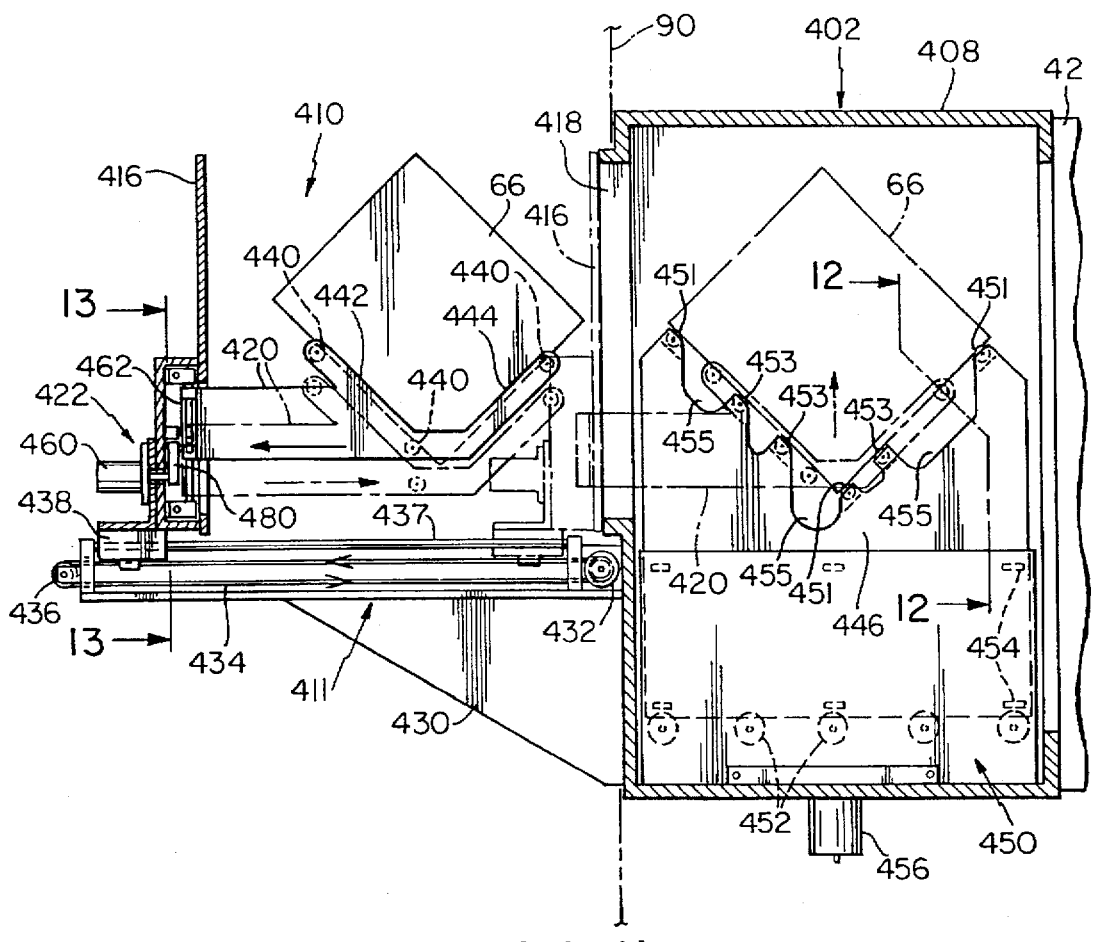
FIG. 11 is a cross-sectional view of the unload lock, taken along the line 11—11 of FIG. 10.
Figure 13:
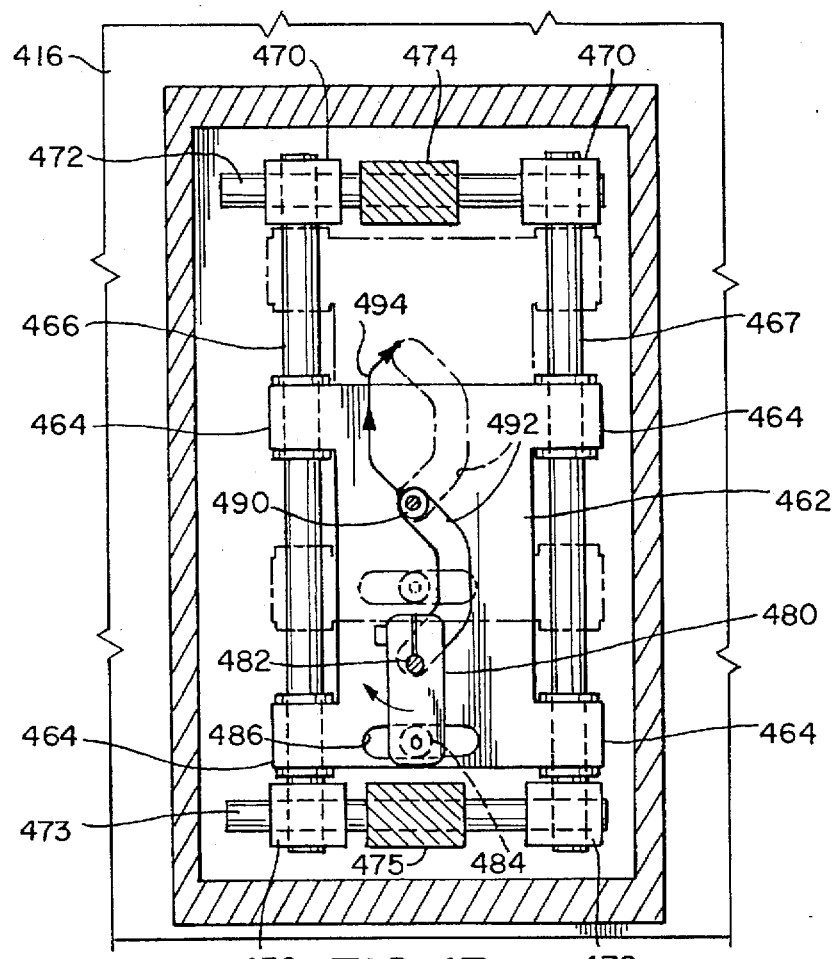
FIG. 13 is a cross-sectional view of the door assembly, taken along the line 13—13 of FIG. 11.

The substrate 66 is transferred from the substrate carrier 446 to the support arm 420 by the transfer mechanism 422. In the load lock 400, the substrate 66 is transferred from the support arm to the substrate carrier in a similar, but reversed, operation. As best shown in FIGS. 11 and 13, the transfer mechanism 422 includes a cam action motor 460 mechanically coupled to a movable carriage 462. The substrate support arm 420 is rigidly attached to the carriage 462. The carriage 462 includes linear bearings 464 that are movable along parallel, vertical shafts 466 and 467. The upper and lower ends of shafts 466 and 467 are mounted in connecting blocks 470, which include linear bearings that are movable along parallel, horizontal shafts 472 and 473. The shafts 472 and 473 are mounted to stationary brackets 474 and 475, respectively. Thus, carriage 462 is movable, both vertically and horizontally, under control of motor 460.

Figure 12:
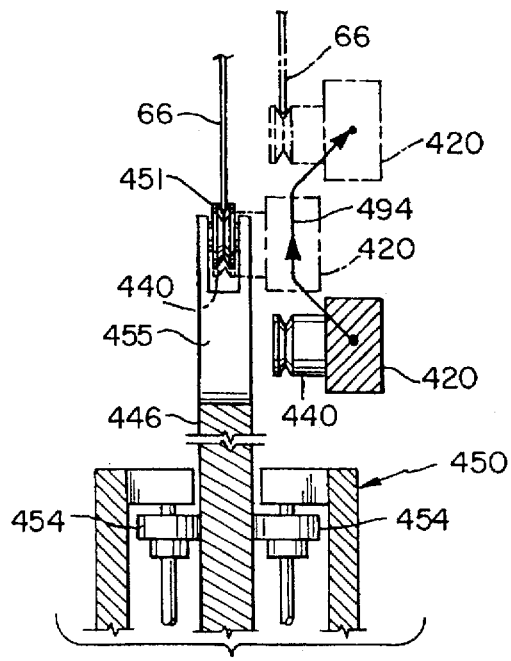
FIG. 12 is a schematic, cross-sectional view of the unload lock, taken along the line 12—12 of FIG. 11.

A crank arm 480 is attached to a shaft 482 of motor 460 and to a cam follower 484 that is movable in a horizontal slot 486 in carriage 462. A stationary cam follower 490 extends through a guide slot 492 in carriage 462. The guide slot 492 establishes a path of movement of the carriage 462 and the substrate support arm 420 when motor 460 rotates crank arm 480. Preferably, the guide slot 492 includes three segments: a vertical center segment, an upper segment that extends away from the center segment at about 45° and a lower segment that extends away from the center segment at about 45°. The guide slot 492 defines the movement of the substrate support arm 420 in removing a substrate from the substrate carrier 446 in unload lock 402 (and in transferring a substrate to carrier 446 in load lock 400). When the motor 460 is energized, the crank arm 480 is rotated through 180° and the carriage 462 is lifted from the position shown in solid lines in FIG. 13 to the position shown in phantom. The stationary cam follower 490 and the guide slot 492 cause the carriage 462 to follow a path 494 between the lower and upper positions. As shown in FIG. 12, support arm 420 moves along the lower segment of path 494, causing wheels 440 to move toward substrate carrier 446 and under substrate 66. Then, support arm 420 moves along the vertical segment of path 494, causing the substrate 66 to be lifted from substrate carrier 446. Finally, support arm 420 moves along the upper segment of path 494, causing the substrate 66 to be moved away from the substrate carrier 446. It will be understood that the movement of the support arm 420 is not limited to the path 494 shown in FIGS. 12 and 13.

When the substrate 66 is transferred to substrate carrier 446 in the load lock 400, the support arm 420 follows path 494, but in the opposite direction. That is, the substrate 66 is moved over carrier 446 and then is lowered, so that the substrate 66 rests in the V-wheels 451 in carrier 446. Then, the support arm 420 is moved away from the substrate carrier 446.

As noted above, the load lock 400 and the unload lock 402 are mirror images and operate in the same manner. The embodiment of the load and unload locks shown in FIGS. 10–13 and described above has the advantages of a relatively small door, thus reducing the risk of particulate contamination. In addition, a relatively small mass is moved during handling of substrates, and the associated air movement is relatively small. The system can be installed such that the load and unload locks are located within a clean room and the door assemblies 406 and 410 extend through clean room wall 90 for loading and unloading of substrates by a robot system.

The vacuum processing system of the invention has been described as having six processing chambers and six substrate carriers. It will be understood that different numbers of processing chambers can be included in the system, depending on the requirements of a particular application. The processing chambers can be configured to perform processes other than those described. Any required mix of different processing chambers can be utilized. Furthermore, different numbers of substrate carriers can be included in the system, depending on the throughput requirements and the number of processing chambers. In addition, any suitable mechanism can be utilized for transporting substrates through the system in a vertical orientation. Finally, any suitable techniques can be utilized for loading substrates into the system and for unloading substrates from the system.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A vacuum processing system comprising:

a load lock for loading substrates into the system;

a plurality of processing chambers for processing said substrates;

an unload lock for unloading said substrates from the system;

a central buffer chamber coupled to said load lock, to each of said processing chambers and to said unload lock through gate valves, said buffer chamber containing a turntable that is rotatable about a vertical axis;

means for vacuum pumping said load lock, said processing chambers, said unload lock and said central buffer chamber;

rotation means for rotating said turntable about said vertical axis;

two or more substrate carriers, each of which supports a substrate in a vertical orientation as it is transported within the system and each of which supports the substrate in a vertical orientation within a selected one of said processing chambers independently of said turntable and said buffer chamber as the substrate is processed;

transport means for transporting said substrate carriers horizontally to and between said load lock and said turntable, to and between said turntable and said selected one of said processing chambers, and to and between said turntable and said unload lock; and control means for controlling said rotation means and said transport means such that each of said substrate carriers follows a selected path through said system, whereby two or more substrates can be transported through the system and processed concurrently and independently.

2. A vacuum processing system as defined in claim 1 wherein said turntable includes first and second substrate carrier positions, each spaced from the vertical axis of said turntable by a distance D and wherein said transport means includes means for moving said substrate carriers between said load lock and said substrate carrier positions on said turntable.

3. A vacuum processing system as defined in claim 2 wherein said transport means further includes means for moving said substrate carriers between said first and second substrate carrier positions on said turntable, and said processing chambers.

4. A vacuum processing system as defined in claim 3 wherein said transport means further includes means for moving said substrate carriers between said first and second substrate carrier positions on said turntable, and said unload lock.

5. A vacuum processing system as defined in claim 4 wherein said processing chambers are grouped in pairs around said buffer chamber and wherein each of said processing chambers has a substrate processing position that falls on a straight line spaced from the vertical axis of rotation of said turntable by said distance D.

6. A vacuum processing system as defined in claim 1 wherein said load lock includes a door having a substrate holder and wherein said load lock further includes means for transferring said substrate from said substrate holder to one of said substrate carriers after said door has been closed and said load lock has been evacuated, such that said substrate carriers remain at high vacuum at all times during operation of the system.

7. A vacuum processing system as defined in claim 6 wherein said control means includes means for enabling said transport means to transport said one of said substrate carriers into said load lock for receiving said substrate only when said load lock is evacuated.

8. A vacuum processing system as defined in claim 1 wherein said unload lock includes a door having a substrate holder and wherein said unload lock further includes means for transferring said substrate from one of said substrate carriers to said substrate holder before said unload lock is vented, such that said substrate carriers remain at high vacuum at all times during operation of the system.

9. A vacuum processing system as defined in claim 8 wherein said control means includes means for enabling said transport means to transport said one of said substrate carriers from said unload lock to said buffer chamber before said unload lock is vented for removal of said substrate.

10. A vacuum processing system as defined in claim 1 wherein each of said substrate carriers includes means for holding a rectangular glass substrate in a vertical orientation with its edges at about 45° with respect to horizontal.

11. A vacuum processing system as defined in claim 1 wherein six of said processing chambers are disposed around said buffer chamber and wherein six of said substrate carriers are used for transporting substrates within said system.

12. A vacuum processing system as defined in claim 11 wherein said processing chambers include one or more sputtering chambers and one or more preheating chambers.

13. A vacuum processing system as defined in claim 1 wherein said transport means includes a plurality of rollers and means for rotating said rollers.

14. A vacuum processing system as defined in claim 13 wherein said rollers are located below said substrate to inhibit particulate contamination of said substrate.

15. A vacuum processing system as defined in claim 1 wherein said turntable includes first and second substrate carrier positions equally spaced from the vertical axis of rotation of said turntable by a distance D.

16. A vacuum processing system as defined in claim 15 wherein each of said processing chambers has a substrate processing position located along a straight line spaced from the vertical axis of rotation of said turntable by said distance D, such that said substrate carriers can be moved along said straight line between the first and second substrate carrier positions on said turntable and said substrate processing position.

17. A vacuum processing system as defined in claim 1 wherein each of said substrate carriers comprises a plate having first and second upper edges which intersect at a right angle, said first and second upper edges each having a groove for receiving said substrate.

18. A vacuum processing system as defined in claim 17 wherein said transport means comprises a plurality of rollers on which said plate rests and means for rotating said rollers to transport said plate.

19. A vacuum processing system as defined in claim 18 wherein said transport means further includes guide wheels that abut against sides of said plate and maintain said plate in a vertical orientation as it is transported through said system.

20. A vacuum processing system as defined in claim 1 wherein said load lock and said unload lock each comprise:

an enclosure defining a lock chamber;

a carrier transport assembly for transporting a substrate carrier to and between said lock chamber and said central buffer chamber;

a door assembly including a door, a substrate support arm and a transfer mechanism for transferring a substrate to and between said support arm and said substrate carrier; and a linear drive mechanism for linearly moving said door assembly between an open position for transfer of a substrate to or from said support arm and a closed position for transfer of said substrate to and between said support arm and said substrate carrier.

21. A vacuum processing system as defined in claim 20 wherein said transfer mechanism comprises a movable carriage having said substrate support arm rigidly attached thereto, a drive motor and a cam linkage coupled between said drive motor and said movable carriage for moving said carriage and said substrate support arm along a prescribed path.

22. A vacuum processing system as defined in claim 21 wherein said prescribed path includes a first segment wherein said support arm moves toward said substrate carrier, a second segment wherein said support arm moves vertically for raising or lowering said substrate and a third segment for moving said support arm away from said substrate carrier.

23. A method for handling substrates in a vacuum processing system comprising:

a) providing a vacuum processing system including a central buffer chamber, a load lock, an unload lock, two or more processing chambers disposed around said buffer chamber and coupled to said buffer chamber, and two or more substrate carriers for transporting substrates within said system, each of said substrate carriers supporting a substrate in a vertical orientation as it is transported within the system;

b) loading a substrate into the load lock and evacuating the load lock;

c) transferring the substrate to one of said substrate carriers;

d) transporting the substrate and the substrate carrier from the load lock onto a turntable in the buffer chamber;

e) rotating the turntable about a vertical axis of rotation into alignment with a selected processing chamber of said processing chambers;

f) transporting the substrate and the substrate carrier horizontally from the turntable into said selected processing chamber;

g) processing the substrate in said selected processing chamber with the substrate carrier supporting the substrate in a vertical orientation within the processing chamber independently of the turntable and the buffer chamber;

h) transporting the substrate and the substrate carrier horizontally from said selected processing chamber onto the turntable;

i) rotating the turntable into alignment with the unload lock;

j) transporting the substrate and the substrate carrier from the turntable into the unload lock;

k) transferring the substrate from the substrate carrier to the unload lock;

l) transporting the substrate carrier from the unload lock onto the turntable in the central buffer chamber;

m) venting the unload lock and removing the substrate from the unload lock; and n) repeating steps b) through m) for two or more substrates in a time-multiplexed manner such that the two more substrates are processed concurrently by said system.

24. A method for handling substrates as defined in claim 23 further including repeating steps e) through h) for two or more processing chambers.

25. A method for handling substrates as defined in claim 24 further including the step of providing first and second substrate carrier positions on said turntable, said first and second substrate carrier positions being equally spaced from the vertical axis of rotation of said turntable by a distance D.

* * * * *